(12) United States Patent
Varaprasad et al.

(10) Patent No.: US 10,748,757 B2
(45) Date of Patent: Aug. 18, 2020

(54) THERMALLY REMOVABLE FILL MATERIALS FOR ANTI-STICTION APPLICATIONS

(71) Applicant: Honeywell International Inc., Morris Plains, NJ (US)

(72) Inventors: Desaraju Varaprasad, Dublin, CA (US); Songyuan Xie, E. Palo Alto, CA (US)

(73) Assignee: Honeywell International, Inc., Morris Plains, NJ (US)

( * ) Notice: Subject to any disclaimer, the term of this patent is extended or adjusted under 35 U.S.C. 154(b) by 5 days.

(21) Appl. No.: 16/126,010

(22) Filed: Sep. 10, 2018

(65) Prior Publication Data

US 2019/0088464 A1 Mar. 21, 2019

Related U.S. Application Data

(60) Provisional application No. 62/561,481, filed on Sep. 21, 2017.

(51) Int. Cl.
*H01L 21/02* (2006.01)
*H01L 21/027* (2006.01)
(Continued)

(52) U.S. Cl.
CPC .......... *H01L 21/0206* (2013.01); *B08B 3/08* (2013.01); *B08B 7/0085* (2013.01); *B08B 7/04* (2013.01);
(Continued)

(58) Field of Classification Search
CPC ............. H01L 21/0206; H01L 21/0273; H01L 21/02057; B08B 7/04; B08B 7/0085; B08B 3/08; B08B 2220/04
See application file for complete search history.

(56) References Cited

U.S. PATENT DOCUMENTS 4,891,334 A 1/1990 Satoh et al.
6,066,889 A 5/2000 Jones et al.
(Continued)

FOREIGN PATENT DOCUMENTS

JP 3815555 B2 1/2004
JP 2006319063 A 11/2006
(Continued)

OTHER PUBLICATIONS

International Search Report and Written Opinion issued in PCT/US2018/050482, dated Jan. 29, 2019, 9 pages.
(Continued)

*Primary Examiner* — Eric W Golightly
(74) *Attorney, Agent, or Firm* — Faegre Drinker Biddle & Reath LLP

(57) ABSTRACT

A method for preventing the collapse of patterned, high aspect ratio features formed in semiconductor substrates upon removal of wash solutions of the type used to clean etch residues from the spaces between the features. In the present method, the spaces are at least partially filled with a displacement solution, such as via spin coating, to substantially displace the wash solution. The displacement solution includes at least one solvent and at least one fill material which is a polyalkene carbonate (PAC) and/or a saccharide. The solvent is then volatized to deposit the fill material in substantially solid form within the spaces. The fill material may be removed by thermal degradation via heat treatment, wherein the need for removal of the fill material by plasma ashing is obviated in order to prevent or mitigate silicon loss.

15 Claims, 5 Drawing Sheets

(51) Int. Cl.
*B08B 7/00* (2006.01)
*B08B 7/04* (2006.01)
*B08B 3/08* (2006.01)

(52) U.S. Cl.
CPC .... *H01L 21/02057* (2013.01); *H01L 21/0273* (2013.01); *B08B 2220/04* (2013.01)

(56) References Cited

U.S. PATENT DOCUMENTS

| | | | |
|---|---|---|---|
| 6,114,044 | A | 9/2000 | Houston et al. |
| 6,188,301 | B1 | 2/2001 | Kornrumpf et al. |
| 6,358,673 | B1 | 3/2002 | Namatsu |
| 6,376,155 | B2 | 4/2002 | Ito |
| 6,656,666 | B2 | 12/2003 | Simons et al. |
| 6,753,037 | B2 | 6/2004 | Miller et al. |
| 6,833,320 | B2 | 12/2004 | Meagley et al. |
| 6,936,183 | B2 | 8/2005 | Chinn et al. |
| 7,119,025 | B2 | 10/2006 | Daley et al. |
| 7,338,614 | B2 | 3/2008 | Martin et al. |
| 7,358,008 | B2 | 4/2008 | Nanno et al. |
| 7,371,509 | B2 | 5/2008 | Hishiro |
| 7,402,488 | B2 | 7/2008 | Cho et al. |
| 7,438,990 | B2 | 10/2008 | Nanno et al. |
| 7,473,598 | B2 | 1/2009 | Liao et al. |
| 7,514,174 | B2 | 4/2009 | Nanno et al. |
| 7,687,406 | B2 | 3/2010 | Daley et al. |
| 7,749,909 | B2 | 7/2010 | Tomita et al. |
| 7,763,549 | B2 | 7/2010 | Tagawa |
| 7,846,623 | B2 | 12/2010 | Hishiro |
| 8,058,219 | B2 | 11/2011 | Rath et al. |
| 8,367,594 | B2 | 2/2013 | Mikhaylichenko |
| 8,541,301 | B2 | 9/2013 | Dubois et al. |
| 8,552,538 | B2 | 10/2013 | Daley et al. |
| 8,617,993 | B2 | 12/2013 | Yasseri et al. |
| 8,795,952 | B2 | 8/2014 | Somervell et al. |
| 8,956,981 | B2 | 2/2015 | Daley et al. |
| 9,111,950 | B2 | 8/2015 | Sun et al. |
| 9,454,081 | B2 | 9/2016 | Somervell et al. |
| 9,502,287 | B2 | 11/2016 | Ting et al. |
| 9,524,863 | B2 | 12/2016 | Ogihara et al. |
| 2004/0038155 | A1 | 2/2004 | Simons et al. |
| 2004/0132855 | A1* | 7/2004 | Kohl ............... B81C 1/00103 522/150 |
| 2004/0139987 | A1 | 7/2004 | Mount |
| 2004/0204328 | A1 | 10/2004 | Zhang et al. |
| 2005/0142481 | A1* | 6/2005 | Jung ............... C08F 216/34 430/271.1 |
| 2007/0009839 | A1 | 1/2007 | Harumoto |
| 2007/0295365 | A1 | 12/2007 | Miya et al. |
| 2009/0032962 | A1 | 2/2009 | Hougham et al. |
| 2009/0229637 | A1 | 9/2009 | Yun et al. |
| 2010/0015744 | A1 | 1/2010 | Kazinzci |
| 2010/0063183 | A1 | 3/2010 | Sun et al. |
| 2010/0122711 | A1 | 5/2010 | Ryan |
| 2011/0042622 | A1 | 2/2011 | Hishiro |
| 2011/0143545 | A1 | 6/2011 | Okuchi et al. |
| 2011/0189858 | A1 | 8/2011 | Yasseri |
| 2013/0280123 | A1 | 10/2013 | Chen et al. |
| 2014/0017844 | A1 | 1/2014 | Anderson et al. |
| 2014/0373384 | A1 | 12/2014 | Sirard et al. |
| 2015/0118821 | A1 | 4/2015 | Millward et al. |
| 2015/0221500 | A1 | 8/2015 | Ogihara et al. |
| 2016/0033863 | A1 | 2/2016 | Chen et al. |
| 2019/0088470 | A1 | 3/2019 | Varaprasad et al. |

FOREIGN PATENT DOCUMENTS

| | | |
|---|---|---|
| JP | 2013140881 A | 7/2013 |
| KR | 20080046838 A | 5/2008 |
| KR | 100928111 B1 | 6/2009 |
| KR | 20150105589 A | 9/2015 |
| WO | 2013030576 A1 | 3/2013 |

OTHER PUBLICATIONS

International Search REport and Written Opinion issued in PCT/US2018/050494, dated Mar. 22, 2019, 12 pages.

Jozef Brcka, "AXIC Appliction Report No. 10-Photoresist Stripping", Axic, Inc., Santa Clara, CA (1996), 5 pages.

Keun-Sun Kim et al., "Method of IPA Cleaning Process on Temperature and Spin Speed for Prevent Pattern Collapse in DRAM Capacitor", Proceedings of the World Congress on Engineemg and Computer Science 2012, vol. II, WCECS 2012, Oct. 24-26, 2012, San Francisco, USA, 3 pages.

O. Raccurt et al., "Influence of liquid surface tension on stiction of SOI MEMS", Institute of Physics Publishing, J. Micromech. Microeng. 14 (2004) pp: 1083-1090.

* cited by examiner

THERMALLY REMOVABLE FILL MATERIALS FOR ANTI-STICTION APPLICATIONS

CROSS REFERENCE TO RELATED APPLICATIONS

This application claims the benefit under Title 35, U.S.C. § 119(e) of U.S. Provisional Patent Application Ser. No. 61/561,481, filed Sep. 21, 2017, entitled THERMALLY REMOVABLE FILL MATERIALS FOR ANTI-STICTION APPLICATIONS, the disclosure of which is incorporated by reference herein in its entirety.

BACKGROUND

1. Field of the Disclosure

The present disclosure relates to the manufacture of electronic components via photolithography techniques, and the mitigation or prevention of collapse, or stiction, which may occur between pattered, high aspect ratio features of semiconductor substrates upon removal of aqueous wash solutions of the type used to remove etch residue.

2. Description of the Related Art

During manufacture of electronic components, such as memory cells and other components built on a semiconductor substrate, such as a pure or doped silicon wafer, the substrate is processed using photolithography techniques. For example, a photoresist may be deposited onto a flat silicon wafer, followed by patterning the photoresist using UV exposure, for example. Then, the photoresist is developed to facilitate to remove of portions of the photoresist corresponding to the locations of trenches formed between narrow or high aspect ratio features formed on the substrate.

Next, an etching process, such as a plasma etch, is used to etch the trenches into the silicon wafer between the remaining photoresist portions, followed by removing the remaining photoresist and any remaining etchant or other debris using a wash solution which is typically an aqueous solution. In this manner, after the wash step, a series of elongated, vertically-disposed high aspect ratio silicon features are present which extend from the underlying silicon wafer, with the wash solution disposed within the trenches or spaces between the silicon features.

Problematically, as shown in FIG. 1, direct evaporation of the wash solution at this stage tends to cause the patterned, high aspect ratio features to collapse on one another due to effects of the surface tension and capillary forces of the water of the wash solution. Collapse of high aspect ratio features concurrent with wash solution removal is a common failure mode in high resolution photolithography, particularly in less than 0.1 micron photolithography techniques, and is sometimes referred to as "stiction". In order to mitigate collapse of patterns during wafer drying, rinsing with isopropyl alcohol (IPA) and/or surface modification treatments may be employed. While these methods are successful in some pattern designs, in more recent, advanced designs of high aspect ratio nanostructures preventing collapse of structures continues to be a challenge.

In other methods of overcoming stiction-induced collapse of high aspect ratio features, a displacement solution of polymer fill may be introduced into the spaces between the high aspect ratio features to substantially displace the wash solution. Then, volatile components of the displacement solution are removed with heat treatment, with the polymer remaining within the spaces in substantially solid form to support the high aspect ratio features. The polymer is then removed using removal processes such as plasma ashing, with oxygen or hydrogen based plasma in conjunction with nitrogen or helium, for example.

However, plasma-based processes may potentially lead to the loss of silicon due to oxidation or nitridation of the high aspect ratio features, and many advanced memory designs are not able to tolerate such loss of silicon due to chemical conversion during the removal of polymer fills using plasma ashing process. Other advanced memory designs, such as transistor-less 3D-XPoint memory technology, cannot tolerate plasma ashing processes for removal of polymer fills used for stiction control.

SUMMARY

The present disclosure provides a method for preventing the collapse of patterned, high aspect ratio features formed in semiconductor substrates upon removal of wash solutions of the type used to clean etch residues from the spaces between the features. In the present method, the spaces are at least partially filled with a displacement solution, such as via spin coating, to substantially displace the wash solution. The displacement solution includes at least one solvent and at least one fill material which is a polyalkene carbonate (PAC) and/or a saccharide. The solvent is then volatized to deposit the fill material in substantially solid form within the spaces. The fill material may be removed by thermal degradation via heat treatment, wherein the need for removal of the fill material by plasma ashing is obviated in order to prevent or mitigate silicon loss.

In one form thereof, the present disclosure comprises a method for preventing collapse of semiconductor substrate features, including the steps of: providing a patterned semiconductor substrate having a plurality of high aspect ratio features with spaces between the features, the spaces at least partially filled with a wash solution; displacing the wash solution with a displacement solution including at least one primary solvent and at least one fill material selected from the group consisting of polyalkene carbonates (PAC) polymers and saccharides, the at least one fill material having a thermal degradation temperature; exposing the substrate to a first elevated temperature below the thermal degradation temperature of the fill material to substantially remove the solvent from the spaces and deposit the fill material in substantially solid form within the spaces; and exposing the substrate to a second elevated temperature at or above the thermal degradation temperature of the fill material to thermally degrade and remove the fill material from the spaces.

The at least one fill material may include at least one polyalkene carbonate (PAC) polymer selected from the group consisting of polypropylene carbonate, polybutylene carbonate, poly(cyclohexene) carbonate, poly(cyclohexenepropylene) carbonate, poly(norborene) carbonate, and combinations thereof. The at least one fill material may be polypropylene carbonate present in an amount between 5 wt. % and 15 wt. % based on an overall weight of the displacement solution. The at least one fill material may include at least one saccharide selected from the group consisting of monosaccharides, disaccharides, and combinations thereof.

The first temperature may be between 100° C. and 175° C. and/or the second temperature is between 250° C. and 300° C. Further, the at least one primary solvent may have a boiling point between 50° C. and 250° C. The displacement step may be carried out via spin coating and/or the at least one polymer is substantially insoluble in water.

The displacement solution may include between 5 wt. % and 30 wt. % of the at least one fill material, based on the total weight of the displacement solution. The displacement solution may further include at least one secondary solvent. The displacement solution may further include at least one catalyst selected from the group consisting of a thermal acid generator (TAG) and a thermal base generator (TBG).

The second exposing step may further include exposing the silicon substrate to a vacuum and/or the exposing steps are conducted in one of an ambient air atmosphere and an atmosphere of an inert gas.

In another form thereof, the present disclosure provides a method for preventing collapse of semiconductor substrate features, including the steps of: providing a patterned semiconductor substrate having a plurality of high aspect ratio features with spaces between the features, the spaces at least partially filled with a wash solution; displacing the wash solution with a displacement solution including at least one solvent and at least one polyalkene carbonate (PAC) polymer, the polymer having a thermal degradation temperature; exposing the substrate to a temperature between 100° C. and 175° C. and below the thermal degradation temperature of the polymer to substantially remove the solvent from the spaces and deposit the polymer in substantially solid form within the spaces; and exposing the substrate to a temperature between 250° C. and 300° C. and at or above the thermal degradation temperature to thermally degrade and remove the polymer from the spaces.

The at least one polyalkene carbonate (PAC) polymer may be selected from the group consisting of polypropylene carbonate, polybutylene carbonate, poly(cyclohexene) carbonate, poly(cyclohexenepropylene) carbonate, poly(norborene) carbonate, and combinations thereof. The at least one fill material may include polypropylene carbonate present in an amount between 5 wt. % and 15 wt. % based on an overall weight of the displacement solution.

In a further form thereof, the present disclosure provides a method for preventing collapse of semiconductor substrate features, including the steps of: providing a patterned semiconductor substrate having a plurality of high aspect ratio features with spaces between the features, the spaces at least partially filled with a wash solution; at least partially displacing the wash solution with a displacement solution including at least one solvent and at least one saccharide having a thermal degradation temperature; exposing the substrate to a temperature between 100° C. and 175° C. and below the thermal degradation temperature of the saccharide to substantially remove the solvent from the spaces and deposit the saccharide in substantially solid form within the spaces; and exposing the substrate to a temperature between 250° C. and 300° C. and at or above the thermal degradation temperature to thermally degrade and remove the saccharide from the spaces.

The at least one saccharide may be selected from the group consisting of monosaccharides, disaccharides, and combinations thereof, and the at least one saccharide may be sucrose.

BRIEF DESCRIPTION OF THE DRAWINGS

The above mentioned and other features of the disclosure, and the manner of attaining them, will become more apparent and the disclosure itself will be better understood by reference to the following description of embodiments of the disclosure taken in conjunction with the accompanying drawings.

Corresponding reference characters indicate corresponding parts throughout the several views. The exemplifications set out herein are provided to illustrate certain exemplary embodiments and such exemplifications are not to be construed as limiting the scope in any manner.

DETAILED DESCRIPTION

Figure 1:
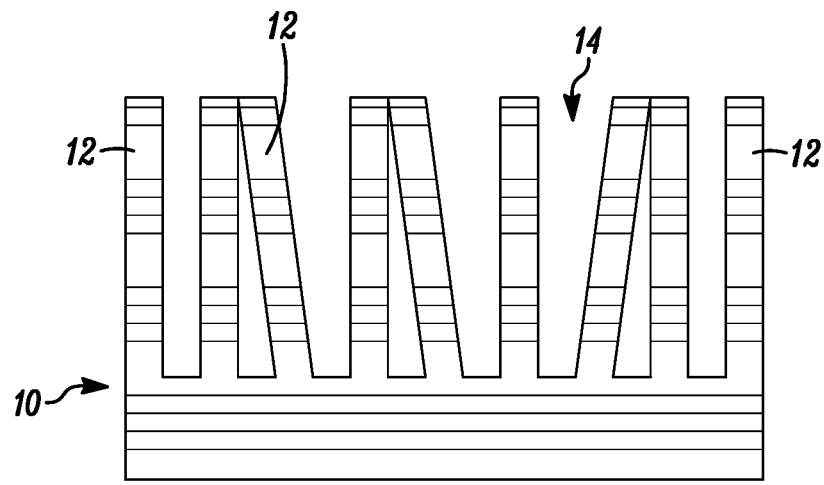
FIG. 1 is a sectional view of a semiconductor substrate which has been patterned to form high aspect ratio features, showing collapse of the features upon water removal according to prior processes.
Figure 2:
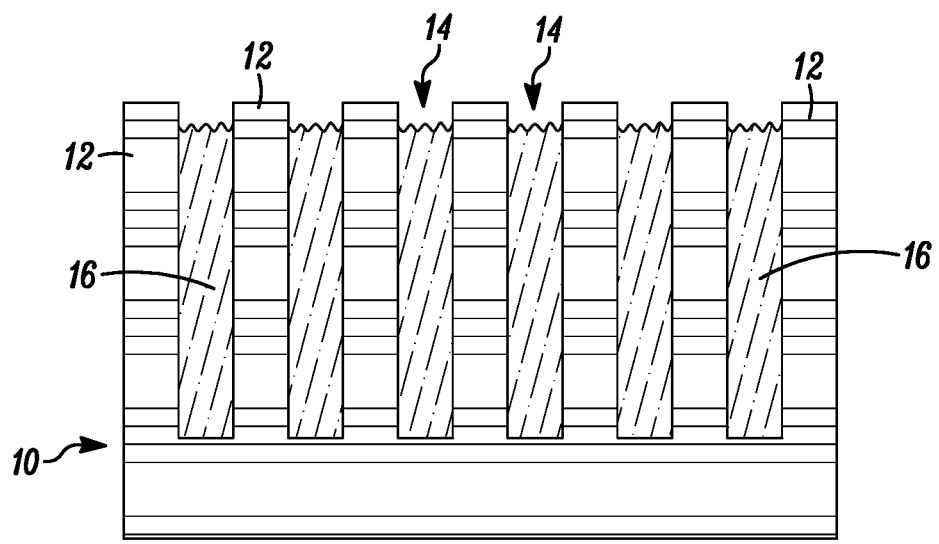
FIG. 2 is a view of a semiconductor substrate with high aspect ratio features after photolithographic pattering, additionally showing aqueous wash solution disposed within the spaces between the features after etch residues are removed.

Referring to FIG. 2, a semiconductor substrate 10, such as a pure or doped silicon wafer, is shown, which has been pattered using photolithography techniques to form a number of high aspect ratio features 12, such as pillars or columns, having spaces 14, such as lines or trenches, therebetween. Features 12 may have an aspect ratio of height to width greater than 4:1, or even 10:1 or greater, for example. In FIG. 2, substrate 10 is shown at a stage in which an aqueous wash solution 16 of the type used to clean photolithographic etch residues, is disposed within spaces 14 between the high aspect ratio features 12. As described further below, the aqueous wash solution 16 is displaced by a displacement solution according to the present disclosure.

The present displacement solution includes at least one fill material selected from the group consisting of polyalkene carbonates (PACs) and saccharides.

Specific examples of the polyalkene carbonates include one or more of polyethylene carbonate, polypropylene carbonate, polybutylene carbonate, poly(cyclohexene) carbonate, poly(cyclohexenepropylene) carbonate, and poly(norborene) carbonate. In one embodiment, the polyalkylene carbonate is polypropylene carbonate.

Suitable saccharides include one or more of monosaccharides such as glucose, fructose and galactose, and disaccharides such as sucrose and lactose.

Additionally, more than one of the foregoing polyalkene carbonates may be used in combination, more than one of the foregoing saccharides may be used in combination, and/or one or more polyalkene carbonates may be used in combination with one or more saccharides in the displacement solution.

Typically, the total amount of fill material, based on the overall weight of the displacement solution, may be as low as 5 wt. %, 10 wt. %, or 15 wt. %, or as high as 20 wt. %, 25 wt. %, or 30 wt. %, or may be within any range defined between any pair of the foregoing values, such as between 5 wt. % and 30 wt. %, between 10 wt. % and 25 wt. %, or between 15 wt. % and 20 wt. %, for example, with the remainder being one or more solvents of the type discussed below and/or other additives such as those discussed below.

The foregoing fill materials are generally insoluble in water, though are readily soluble in organic solvents such as one or more of polyglycol methyl ether acetate (PGMEA), ethyl lactate, n-methyl pyrrolidone (NMP), acetone, anisole, n-butyl acetate, and ethyl acetate di(ethylene glycol) ethyl ether acetate (DE Acetate)(carbitol acetate), ethylene glycol diacetate, Dowanol Eph, Dowanol PPH Glycol Ether (propylene glycol phenyl ether), Dowanol PGDA (propylene glycol diacetate), methyl ethyl ketone (MEK), gamma butyrolactone (GBL), N,N-dimethylformamide (DMF), propylene carbonate, tetrahydrofuran (THF), caprolactone, ethyl lactate, 50:50 ethyl acetate/toluene, 50:50 MEK/toluene. Dowanol is a trademark of Dow Chemical Company. Therefore, the displacement solution includes a primary solvent which solvates the fill material. This primary solvent should also be compatible with water to enable the displacement solution to effectively displace the aqueous wash solution in the manner described below.

Optionally, in order to prevent potential coagulation of the fill material during the displacement process described below, the displacement solution may also include a secondary solvent that is at least partially miscible with water and also at least partially solvates the fill material. Examples of such secondary solvents include one or more of acetone, MEK, ethyl lactate, n-methyl pyrrolidone (NMP), and dimethylformamide (DMF).

Typically, the secondary solvent may be present, based on the total weight of the solvents in the displacement solution, in a broadly variable amount between 1 wt. % and 99 wt. %, or between 5 wt. % and 50 wt. %, for example. The primary and secondary solvents may have boiling points as low as 50° C. or as high as 250° C., for example.

Other components of the displacement solution may include surfactants, such as non-fluorinated hydrocarbons, fluorinated hydrocarbons, or combinations thereof, typically present in an amount of at least 0.1 wt. %, and 2.0 wt. % or less, 1.0 wt. % or less, or 0.5 wt. % or less.

The components of the displacement solution may be blended together with simple mixing, for example. When mixed, the displacement solution may have a viscosity as little as 1.0 cP, 2.0 cP, or 3.0 cP, or as high as 10.o cP, 20.0 cP, or 30.o cP, or within any range defined between any pair of the foregoing values, such as between 1.0 cP and 30.0 cP, between 2.0 cP and 20.0 cP, or between 3.0 cP and 10.0 cP, for example, as determined by a Brookfield spindle-type viscometer, such as a Brookfield LVDV-II-PCP or DV-II+ spindle-type viscometer.

Referring to FIGS. 2-5 below, a method of using the present displacement solution is described. In FIG. 2, substrate 10 is shown at a stage following completion of one or more photolithography processes, in which an aqueous wash solution 16 of the type used to remove photolithographic etch residues is disposed within the spaces 14 between the high aspect ratio features 12. Typically, the aqueous wash solution will be primarily an aqueous solution including dissolved or particulate etch residues, and may either partially or completely fill the spaces between the high aspect ratio features.

In an optional first step, an initial flushing solvent such as isopropyl alcohol (IPA) may be used to displace the wash solution 16 prior to displacement of the IPA using the displacement solution of the present disclosure.

Figure 3:
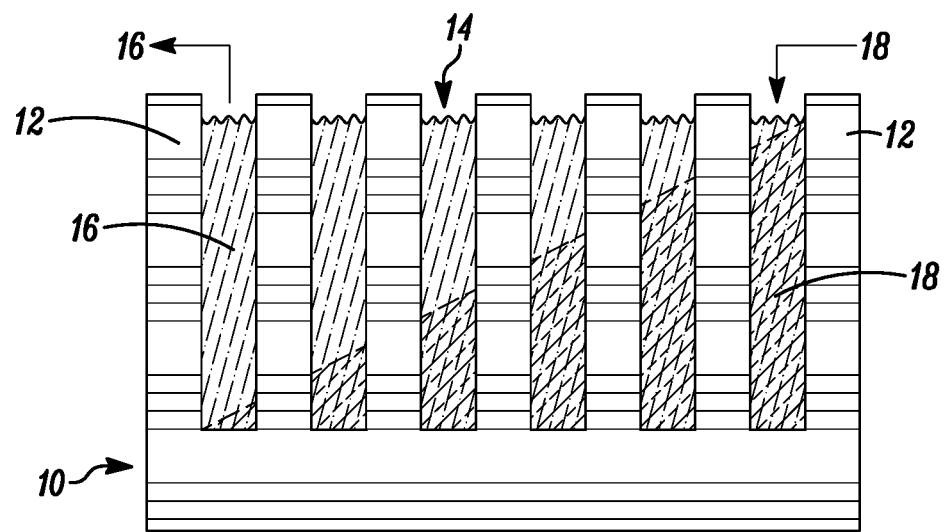
FIG. 3 schematically shows the displacement of the wash solution from the spaces between the high aspect ratio features using a displacement solution in accordance with present disclosure.

Referring to FIG. 3, the displacement solution 18 in accordance with the present disclosure is applied to substrate 10 to volumetrically displace the aqueous wash solution 16 (or may be used to displace an initial flushing solution as discussed above). The displacement solution 18 may be applied to substrate 10 via spin coating, in which the volume of displacement solution applied is sufficient to completely, or substantially completely, volumetrically displace and remove the aqueous wash solution 16, as schematically shown by the dashed diagonal line in the arrows in FIG. 3, in which the displacement solution is spin-coated into spaces 14 between features 12 and displaces aqueous wash solution 16.

In this manner, with continued reference to FIG. 3, the spaces 14 between high aspect ratio features 12 are either completely filled, or substantially filled, with the displacement solution 16. Because the primary solvent of the displacement solution is incompatible with water, the primary solvent is not miscible with water and is therefore able to displace the aqueous wash solution. Concurrently, if a secondary solvent is used in the displacement solution, same is partially miscible with water to prevent coagulation of the polymer upon contact of the displacement solution with the aqueous wash solution.

Next, the substrate 10 is exposed to a first heat treatment step at a first elevated temperature which may be as low as 100° C., 115° C., or 130° C., or as high as 145° C., 160° C., or 175° C., or may be within any range defined between any two of the foregoing values, such as 110° C. to 175° C., 115° C. to 160° C. or 130° C. to 145° C., for example. The first elevated temperature is above the boiling point of water and the solvents in the displacement solution and yet below the decomposition temperature of the fill material of the displacement solution. In this manner, when the substrate is exposed to the first elevated temperature, the volatile components of the displacement solution, such as the primary solvent and secondary solvent, as well as any residual water or residual solvents from the aqueous wash solution which may be present, are removed to deposit the fill material in substantially solid form within the spaces 14 between the high aspect ratio features 12. The first heat treatment step may be carried out in an ambient air atmosphere or, alternatively, may be carried out in a vacuum or in an inert atmosphere under nitrogen or other inert gas, for example.

Figure 4:
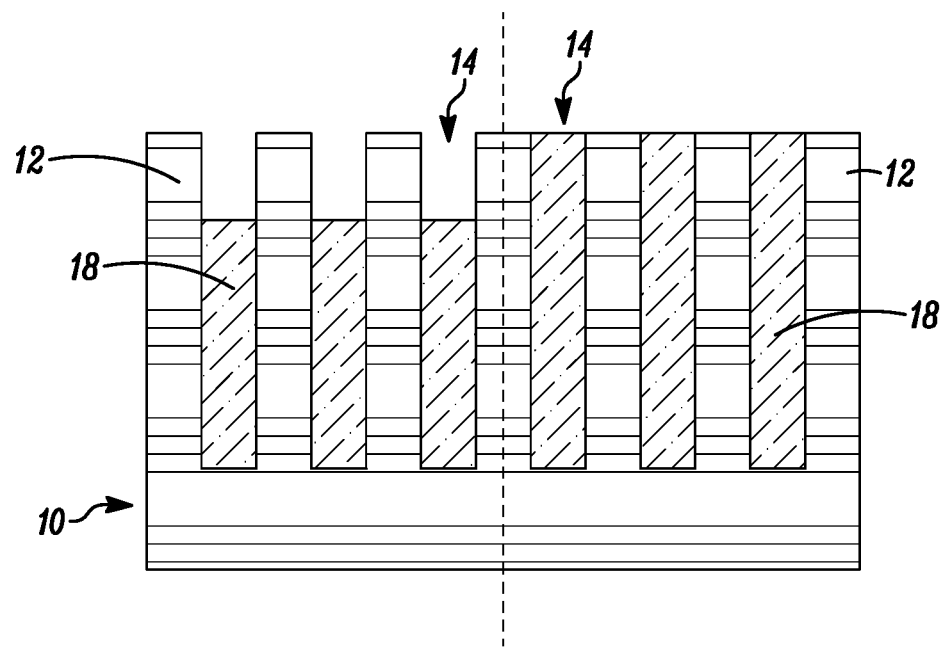
FIG. 4 shows fill material in substantially solid form in the spaces between the high aspect ratio features after removal of the solvent from the displacement solution, with the fill material either partially filling the spaces (at left) or completely filling the spaces (at right)

Referring to FIG. 4, the substrate is shown after the first heat treatment step in which only substantially solid fill material 20 remains within the spaces 14 between the high aspect ratio features 12, with the fill material either partially or substantially filling the spaces, as shown to the left in FIG. 4, or completely filling the spaces, as shown to the right in FIG. 4. Advantageously, the substantially solid material physically supports the high aspect ratio features and prevents their collapse during this and subsequent stages of the present process.

In a final step, the substrate 10 is exposed to a second heat treatment step at a second elevated temperature which may be as low as 250° C., 260° C., or 270° C., or as high as 280° C., 290° C., or 300° C., or may be within any range defined between any two of the foregoing values, such as 250° C. to 300° C., 260° C. to 290° C. or 270° C. to 280° C., for example. The second elevated temperature is at or above the decomposition temperature of the fill material, thereby causing thermal degradation and volatilization of the fill material to remove the fill material from the spaces 14 between the high aspect ratio features 12. The second heat treatment step may be carried out in an ambient air atmosphere or, alternatively, may be carried out in a vacuum or in an inert atmosphere under nitrogen or other inert gas, for example.

In order to promote thermal degradation, the fill material will typically include thermally labile chemical bonds such as ester, peroxide, or azo bonds, for example and, if the fill material is a polymer, such bonds will typically be in the backbone of the polymer chain.

In a further embodiment, a catalyst, such as a thermal acid generator ("TAG"), a thermal base generator ("TBG") and/or reactive gases may be injected into the atmosphere in which substrate 10 is disposed in order to facilitate the degradation and/or removal of the fill material. Suitable catalysts include alkylamines or imidazoles, for example, tetramethylammonium acetate (TMAA), tetramethylammonium hydroxide (TMAH), tetrabutylammonium hydroxide (TBAH), tetrabutylammonium acetate (TBAA), cetyltrimethylammonium acetate (CTAA), tetramethylammonium nitrate (TMAN), other ammonium-based catalysts, amine-based and/or amine-generating catalysts, and combinations thereof. Other exemplary catalysts include (2-hydroxyethyl)trimethylammonium chloride, (2-hydroxyethyl)trimethylammonium hydroxide, (2-hydroxyethyl)trimethylammonium acetate, (2-hydroxyethyl)trimethylammonium formate, (2-hydroxyethyl)trimethylammonium nitrate, (2-hydroxyethyl)trimethylammonium benzoate, tetramethylammonium formate and combinations thereof. Other exemplary catalysts include (carboxymethyl)trimethylammonium chloride, (carboxymethyl)trimethylammonium hydroxide, (carboxymethyl)trimethyl-ammonium formate and (carboxymethyl)trimethylammonium acetate.

Figure 5:
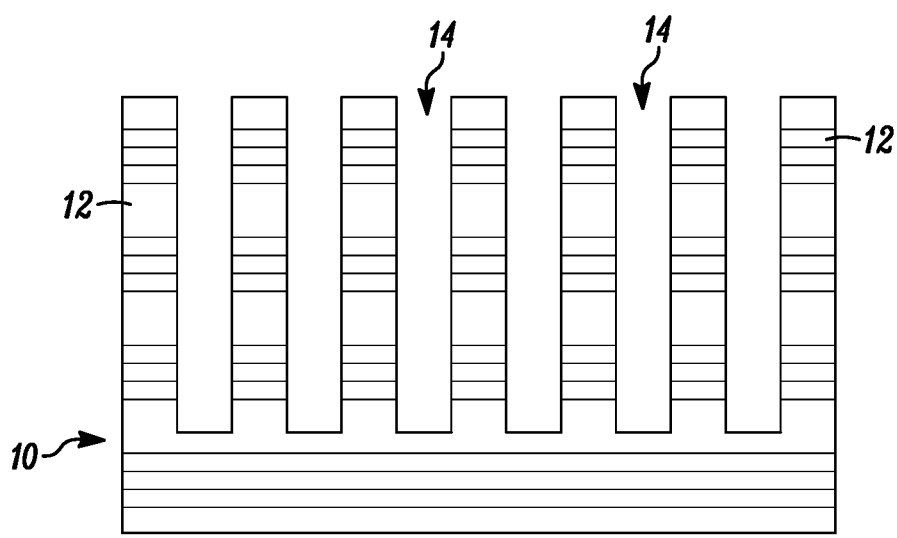
FIG. 5 shows the silicon substrate and high aspect ratio features after removal of the fill material.

Referring to FIG. 5, after the fill material is completely removed from spaces 14 between high aspect ratio features 12 of substrate 10, spaces 14 will be completely empty, with the geometry of the high aspect ratio features 12 preserved without collapse. Substrate 10 may then be subjected to further downstream processing steps as desired.

Advantageously, the removal of fill material from spaces 14 between high aspect ratio features 12 via thermal degradation of the fill material obviates the need for use of plasma etch processes which, in some prior techniques, cause the removal of silicone from substrate 10 or its features 12, thereby compromising the resolution or geometry of the features 12.

As used herein, the phrase "within any range defined between any two of the foregoing values" literally means that any range may be selected from any two of the values listed prior to such phrase regardless of whether the values are in the lower part of the listing or in the higher part of the listing. For example, a pair of values may be selected from two lower values, two higher values, or a lower value and a higher value.

The following non-limiting Examples serve to illustrate the disclosure.

EXAMPLES

Example 1

Exemplary Polyalkene Carbonate (PAC) Displacement Solution Formulations

Displacement solution formulations of this disclosure were prepared from commercially available solid resins of each polymer as listed in Table 1 below by dissolving in suitable solvents. Resulting formulations contained % solids as shown in the table. The solutions were spin coated on 4" silicon wafers and baked for 60 seconds each on contact hot plates at 80° C. and 160° C. Film thickness and refractive index data are as shown in the Table 1 below.

TABLE 1

| Materials and Formulations | Form. 1 (gm) | Form. 2 (gm) | Form. 3 (gm) | Form. 4 (gm) | Form. 5 (gm) |
| --- | --- | --- | --- | --- | --- |
| Polyethylene carbonate | 1.0 | 0 | 0 | 0 | 0 |
| Polypropylene carbonate | 0 | 5.1 | 0 | 0 | 0 |
| Polybutylene carbonate | 0 | 0 | 1.0 | 0 | 0 |
| Polycyclohexene-propylene carbonate | 0 | 0 | 0 | 1.0 | 0 |
| Polycyclohexene carbonate | 0 | 0 | 0 | 0 | 1.0 |
| Polyglycol methyl ether acetate (PGMEA) | 0 | 46.26 | 0 | 0 | 0 |
| Dimethylformamide (DMF) | 19.0 | 0 | 0 | 0 | 0 |
| Anisole | 0 | 0 | 19.0 | 19.0 | 19.0 |
| total | 20.0 | 51.4 | 20.0 | 20.0 | 20.0 |
| % solids | 5 | 10 | 5 | 5 | 5 |
| Spin RPM | 1000 | 1500 | 1000 | 1000 | 1000 |
| FT(A) | 146 | 4878 | 3000 | 2788 | 3030 |
| RI at 633 nm | — | 1.46 | 1.46 | 1.49 | 1.47 |
| Contact Hot Plate | | 80 C./160 C./60 sec each | | | |

Figure 6:
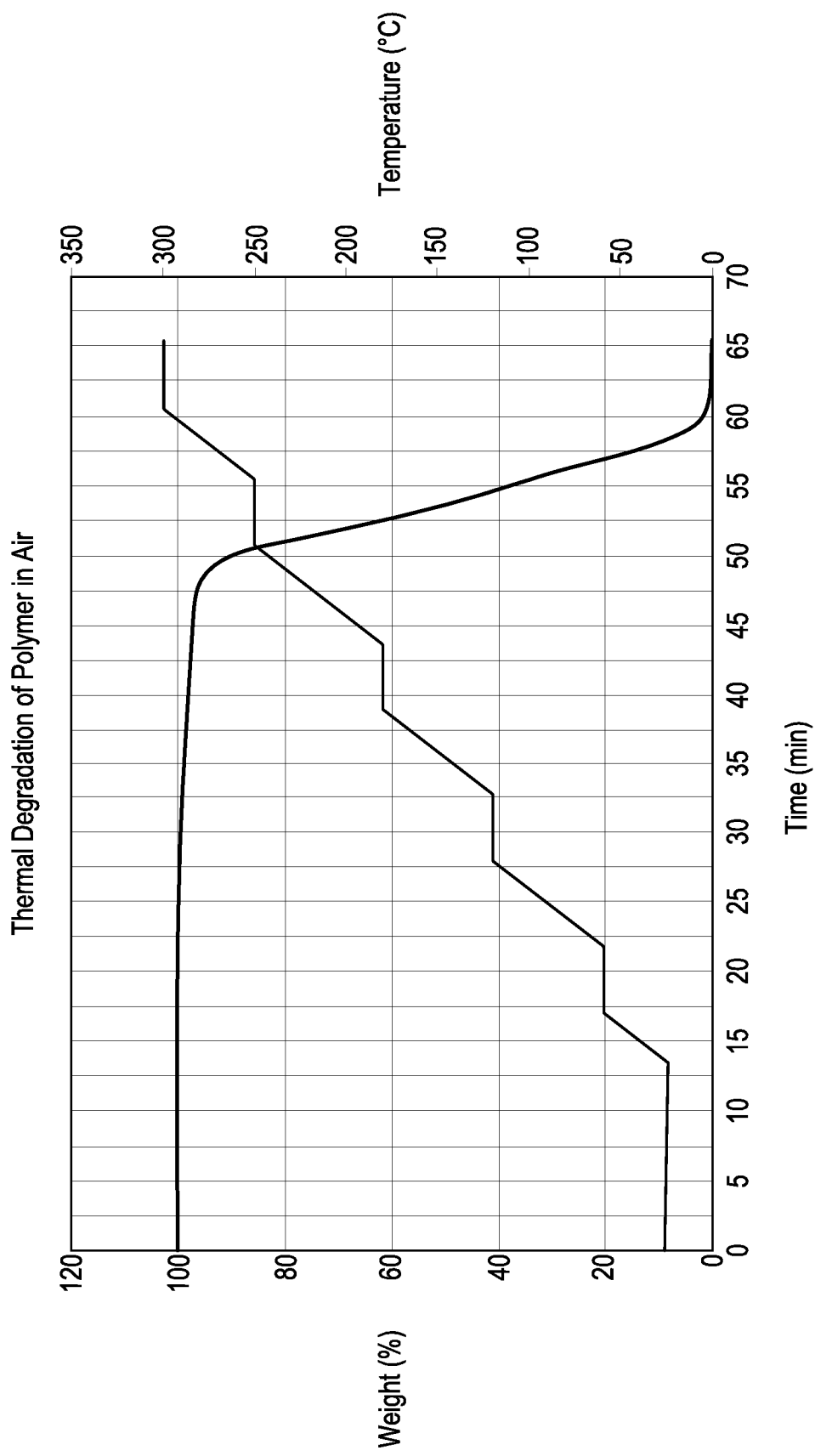
FIG. 6 corresponds to Example 1, and shows weight percent and temperature as a function of time for an exemplary displacement solution.

Thermal degradation of Formulation 2 was evaluated by thermogravimetric analysis (TGA) as shown in the FIG. 6, which indicates that polypropylene carbonate will cleanly burn off at temperatures equal to or greater than 250° C. Thermal degradation of Formulations 2-5 is set forth in FIG. 7 corresponding to Example 4 below. In this manner, it was confirmed that polyalkene carbonates may be suitable for applications where solid polymer fill needs to be thermally removed at temperatures of about 300° C.

Example 2

Exemplary Saccharide Displacement Solution Formulation

A displacement solution formulation based on sucrose of this disclosure was prepared from commercially available sucrose as set forth in Table 2 below by dissolving the sucrose in a mixture of water and isopropyl alcohol (IPA). The resulting formulation contained 10% solids as shown in Table 2. The solution was then spin coated on 4" silicon wafers and baked for 60 seconds each on contact hot plates at 80° C. and 150° C. Film thickness and refractive index data are as shown in Table 2 below.

TABLE 2

| Materials and Formulation | Form. 6 (gm) |
| --- | --- |
| Sucrose | 2 |
| Isopropyl alcohol (IPA) | 11.25 |
| water | 6.75 |
| total | 20 |
| % solids | 10 |
| Spin RPM | 1500 |
| FT (A) | 5253 |
| RI at 633 nm | 1.52 |
| Contact Hot Plate | 80 C./150 C./60 sec each |

Figure 7:
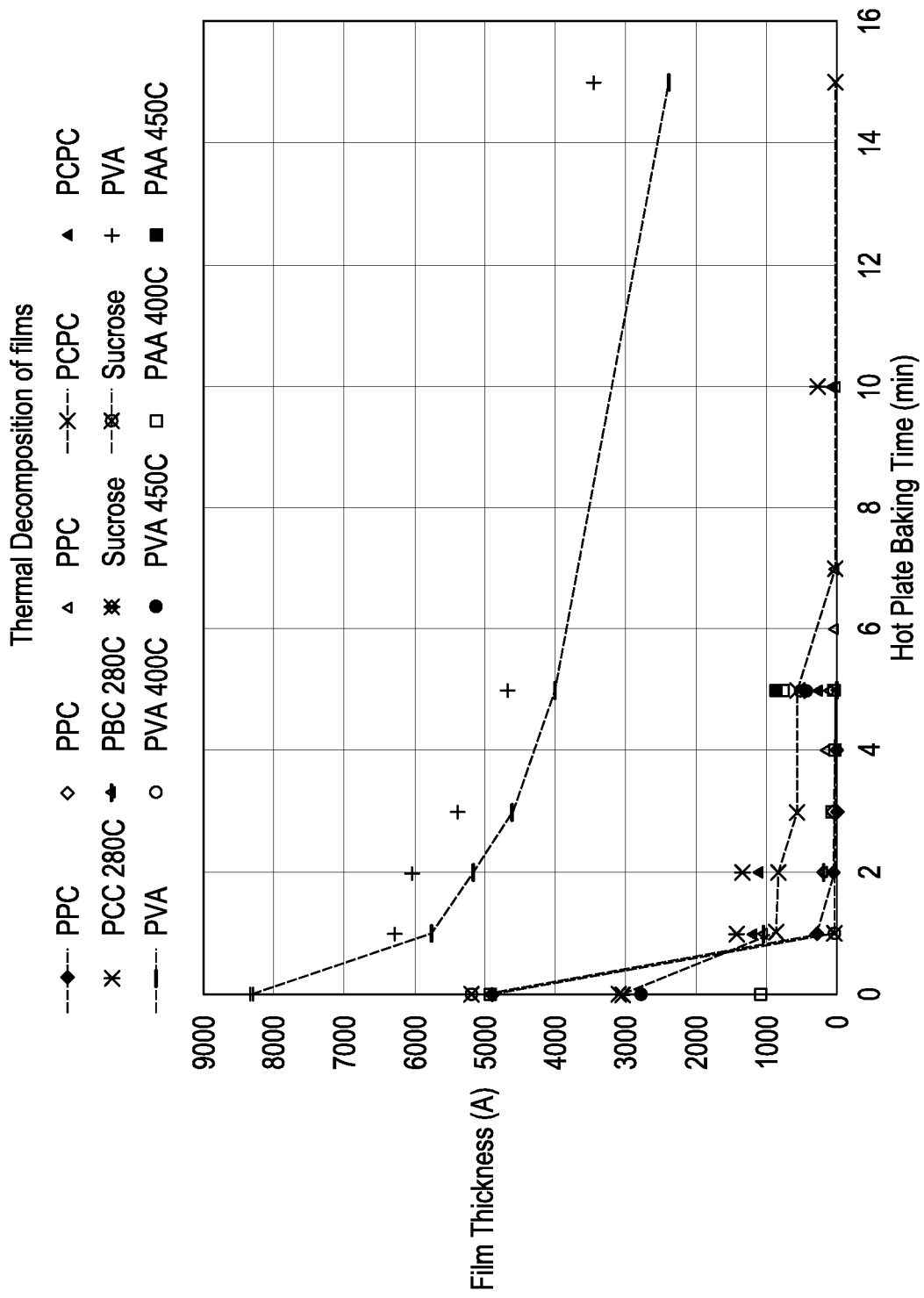
FIG. 7 corresponds to Example 4, and shown thermal decomposition data of films of Examples 1-3.

Thermal degradation of the sucrose films were evaluated by change in film thickness as a function of temperature and time as shown in FIG. 7 described below. In this manner, it was confirmed that sucrose films may be suitable for applications where solid polymer fill needs to be thermally removed at temperatures of about 300° C.

Example 3

Comparative Displacement Solution Formulations

Coating formulations of known, comparative polymers were prepared from commercially available polyvinyl alcohol (PVA) and polyacrylamide (PAAM) as listed in Table 3 below by dissolving in water. Resulting formulations contained 5-7% solids as shown in Table 3. The solutions were then spin coated on 4" silicon wafers and baked for 60 seconds each on contact hot plates at 80° C. and 150° C. Film thickness and refractive index data are as shown in Table 3 below.

TABLE 3

| Material/Formulation | Comp. Form. 1 (gm) | Comp. Form. 2 (gm) |
|---|---|---|
| 14% PVA in water | 20 | 0 |
| 50% PAAM in water | 0 | 1 |
| water | 20 | 9 |
| total | 40 | 10 |
| % solids | 7 | 5 |
| Spin RPM | 800 | 1000 |
| FT(A) | 2780 | 138 |
| RI at 633 nm | 1.52 | — |
| Contact Hot Plate | 80 C./150 C./60 sec each | |

Thermal degradation of these comparative polymer films was evaluated by change in film thickness as a function of temperature and time as shown in Table 3 above and FIG. 7 corresponding to Example 4 below. In this manner, it was confirmed that the comparative polymers are not suitable for applications where solid polymer fill needs to be thermally removed at temperatures of about 300° C.

Example 4

Thermal Degradation Study

The displacement solutions of Examples 1 and 2 above, which were based on polyalkene carbonates and saccharides, respectively, were formed on 4" silicon wafers as described in Examples 1 and 2. In addition, comparative polymers of Example 3 above were also deposited on silicon wafers. Thermal removability of these coatings was determined by heating the coated wafers at different temperatures for varying durations as summarized in Table 4 below and by periodically monitoring change in film thickness.

TABLE 4

| | Polymer Films | | | | | | | | | | | | | | |
|---|---|---|---|---|---|---|---|---|---|---|---|---|---|---|---|
| | Examples 1 and 2 | | | | | | | | | Example 3 | | | | | |
| | Form. 2 (PPC) | | | Form. 4 (PCPC) | | Form. 5 (PCC) | Form. 3 (PBC) | Form. 6 (Sucrose) | | Comp. Form. 1 (PVA) | | | | Comp. Form. 1 (PAA) | |
| | Bake Temp (° C.) | | | | | | | | | | | | | | |
| Time (min) | 280 | 270 | 260 | 300 | 280 | 280 | 280 | 280 | 300 | 280 | 300 | 400 | 450 | 400 | 450 |
| 0 | 4878 | 4878 | 4878 | 3102 | 2788 | 3030 | 3000 | 5182 | 5182 | 8311 | 8311 | 2780 | 2780 | 1077 | 1077 |
| 1 | 280 | 1316 | | 865 | 1200 | 1418 | 1045 | 52 | 37 | 6272 | 5763 | | | | |
| 2 | 31 | 217 | | 827 | 1131 | 1341 | 179 | 43 | 31 | 6036 | 5169 | | | | |
| 3 | 22 | 60 | | 562 | | | 32 | 40 | 34 | 5379 | 4601 | | | | |
| 4 | 17 | 21 | 204 | | | | | 38 | 27 | | | | | | |
| 5 | 15 | 16 | 175 | 558 | 275 | 819 | | 19 | | 4678 | 3992 | 478 | 437 | 864 | 752 |
| 6 | | | 86 | | | | | | | | | | | | |
| 7 | | | 50 | 24 | | | | | | | | | | | |
| 8 | | | | | | | | | | | | | | | |
| 9 | | | | | | | | | | | | | | | |
| 10 | | | 16.7 | | 64 | 269 | | | | | | | | | |
| 11 | | | | | | | | | | | | | | | |
| 12 | | | | | | | | | | | | | | | |
| 13 | | | | | | | | | | | | | | | |
| 14 | | | | | | | | | | | | | | | |
| 15 | | | | | 24 | | | | | 3455 | 2385 | | | | |

While polypropylene carbonate and polybutylene carbonate films completely decomposed at 260-280° C. the coatings of polycyclohexene propylene carbonate and polycyclohexene carbonate required more heat for removal. In addition, films of sucrose were also removed at about 300° C.

In comparison, the films of comparative polymers left a significant portions of film residue even after prolonged heating at 300° C. In addition, the comparative films did not completely decompose even at 400-450° C. In this manner, it was confirmed that the displacement solutions of this disclosure, based on polyalkene carbonates and sucrose, are suitable for applications where thermal removability at temperature of about 300° C. is required.

As used herein, the singular forms "a", "an" and "the" include plural unless the context clearly dictates otherwise. Moreover, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the disclosure be limited to the specific values recited when defining a range.

It should be understood that the foregoing description is only illustrative of the present disclosure. Various alternatives and modifications can be devised by those skilled in the art without departing from the disclosure. Accordingly, the present disclosure is intended to embrace all such alternatives, modifications and variances that fall within the scope of the appended claims.

The invention claimed is:

1. A method for preventing collapse of semiconductor substrate features, comprising the steps of:
providing a patterned semiconductor substrate having a plurality of high aspect ratio features with spaces between the features, the spaces at least partially filled with a wash solution;
displacing the wash solution with a displacement solution including at least one primary solvent and at least one fill material, the at least one fill material having a thermal degradation temperature;
exposing the substrate to a first elevated temperature below the thermal degradation temperature of the fill material to substantially remove the solvent from the spaces and deposit the fill material in substantially solid form within the spaces; and
exposing the substrate to a second elevated temperature at or above the thermal degradation temperature of the fill material to thermally degrade and remove the fill material from the spaces;
wherein the at least one fill material comprises at least one polyalkene carbonate (PAC) polymer present in a total amount of between 5 wt. % and 15 wt. % based on an overall weight of the displacement solution.

2. The method of claim 1, wherein the at least one polyalkene carbonate (PAC) polymer is selected from the group consisting of polypropylene carbonate, polybutylene carbonate, poly(cyclohexene) carbonate, poly(cyclohexenepropylene) carbonate, poly(norborene) carbonate, and combinations thereof.

3. The method of claim 1, wherein the first temperature is between 100° C. and 175° C.

4. The method of claim 1, wherein the second temperature is between 250° C. and 300° C.

5. The method of claim 1, wherein the at least one primary solvent has a boiling point between 50° C. and 250° C.

6. The method of claim 1, wherein said displacement step is carried out via spin coating.

7. The method of claim 1, wherein the at least one polyalkene carbonate (PAC) polymer is substantially insoluble in water.

8. The method of claim 1, wherein the displacement solution further includes at least one secondary solvent.

9. The method of claim 1, wherein the displacement solution further includes at least one catalyst selected from the group consisting of a thermal acid generator (TAG) and a thermal base generator (TBG).

10. The method of claim 1, wherein said second exposing step further comprises exposing the silicon substrate to a vacuum.

11. The method of claim 1, wherein said exposing steps are conducted in one of an ambient air atmosphere and an atmosphere of an inert gas.

12. A method for preventing collapse of semiconductor substrate features, comprising the steps of:
providing a patterned semiconductor substrate having a plurality of high aspect ratio features with spaces between the features, the spaces at least partially filled with a wash solution;
displacing the wash solution with a displacement solution including at least one solvent and at least one polyalkene carbonate (PAC) polymer present in a total amount of between 5 wt. % and 15 wt. % based on an overall weight of the displacement solution, the polymer having a thermal degradation temperature;
exposing the substrate to a temperature between 100° C. and 175° C. and below the thermal degradation temperature of the polymer to substantially remove the solvent from the spaces and deposit the polymer in substantially solid form within the spaces; and
exposing the substrate to a temperature between 250° C. and 300° C. and at or above the thermal degradation temperature to thermally degrade and remove the polymer from the spaces.

13. The method of claim 12, wherein the at least one polyalkene carbonate (PAC) polymer is selected from the group consisting of polypropylene carbonate, polybutylene carbonate, poly(cyclohexene) carbonate, poly(cyclohexenepropylene) carbonate, poly(norborene) carbonate, and combinations thereof.

14. The method of claim 1, wherein the displacement solution has a viscosity from 1.0 cP to 20.0 cP.

15. The method of claim 3, wherein the displacement solution has a viscosity from 1.0 cP to 20.0 cP.

* * * * *